US006777717B1

(12) United States Patent
Karlicek

(10) Patent No.: US 6,777,717 B1
(45) Date of Patent: Aug. 17, 2004

(54) LED REFLECTOR FOR IMPROVED LIGHT EXTRACTION

(75) Inventor: Robert F. Karlicek, Flemington, OH (US)

(73) Assignee: GELcore, LLC, Valley View, OH (US)

(*) Notice: Subject to any disclaimer, the term of this patent is extended or adjusted under 35 U.S.C. 154(b) by 0 days.

(21) Appl. No.: 09/947,127

(22) Filed: Sep. 5, 2001

Related U.S. Application Data

(60) Provisional application No. 60/234,119, filed on Sep. 21, 2000.

(51) Int. Cl.[7] .................. H01L 29/22; H01L 29/227
(52) U.S. Cl. .............................. 257/98; 257/95
(58) Field of Search ................................ 257/98, 95

(56) References Cited

U.S. PATENT DOCUMENTS 5,038,356 A * 8/1991 Botez et al. ................ 372/45
6,363,096 B1 * 3/2002 Dodabalapur et al. ...... 372/75

* cited by examiner

Primary Examiner—Amir Zarabian
Assistant Examiner—Kiesha Rose
(74) Attorney, Agent, or Firm—Fay, Sharpe, Fagan, Minnich & McKee, LLP

(57) ABSTRACT

Light emitting diodes are provided with electrode and pad structures which redirect light which otherwise would be blocked by the pad. The LED may be formed as a die with first and second contact surfaces. A pad is in contact with the first contact surface. A reflector is disposed beneath the first pad, and the reflector includes walls that are oblique with respect to the first contact surface.

13 Claims, 2 Drawing Sheets

LED REFLECTOR FOR IMPROVED LIGHT EXTRACTION

CROSS-REFERENCE TO RELATED APPLICATIONS

The present application claims benefit of U.S. Provisional Patent Application Serial No. 60/234,119, filed Sep. 21, 2000, the disclosure of which is hereby incorporated by reference herein

FIELD OF THE INVENTION

The present invention relates to optoelectronic devices such as light-emitting diodes.

BACKGROUND OF THE INVENTION

Light emitting diodes or "LEDs" include thin layers of semiconductor material of two opposite conductivity types, referred to as p-type and n-type. The layers are disposed in a stack, one above the other, with one or more layers of n-type material in one part of the stack and one or more layers of p-type material at the other end of the stack. For example, the various layers may be deposited in sequence on a substrate to form a wafer. The wafer is then cut apart to form individual dies that constitute separate LEDs. The junction between the p-type and n-type material may include directly abutting p-type and n-type layers, or may include one or more intermediate layers which may be of any conductivity type or which may have no distinct conductivity type. In operation, electric current passing through the diode is carried principally by electrons in the n-type layers and by electron vacancies or "holes" in the p-type layers. The electrons and holes move in opposite directions toward the junction and recombine with one another at the junction. Energy released by electron-hole recombination is emitted as light. As used in this disclosure, the term "light" radiation includes infrared and ultraviolet wavelength ranges, as well as the visible range. The wavelength of the light depends on factors including the composition of the semiconductor materials and the structure of the junction.

Electrodes are typically connected to the n-type and p-type layers near the top and bottom of the stack. The materials in the electrodes are selected to provide low-resistance interfaces with the semiconductor materials. The electrodes, in turn, are provided with pads suitable for connection to wires or other conductors that carry current from external sources. The pad associated with each electrode may be a part of the electrode, having the same composition and thickness of the electrode, or may be a distinct structure that differs in thickness, composition, or both from the electrode itself.

Some LEDs have electrodes on the bottom surface of the bottom semiconductor layer. For example, the various layers may be deposited in sequence on an electrically conductive substrate, and the substrate may be left in place on the bottom surface to act as a bottom electrode. Thus, LED's formed from AlInGaP typically use conductive GaAs substrates and may have an electrical connection to the substrate. However, LEDs formed from certain semiconductor materials normally use nonconductive substrates to promote proper formation of the semiconductor layers. The nonconductive substrate typically is left in place, so that an electrode cannot be provided on the bottom surface of the bottom layer. For example, gallium nitride-based materials such as GaN, AlGaN, InGaN and AlInGaN are used to form LEDs emitting light in various wavelength ranges including blue and ultraviolet. These materials typically are grown on insulating substrates such as sapphire or alumina.

LEDs incorporating an insulating substrate must include a bottom electrode at a location on the stack above the substrate but below the junction. Typically, the upper layer or layers of the stack are removed after formation of the stack in a region covering part of the area of each die, so as to provide an upwardly-facing lower electrode surface on a layer at or near the bottom of the stack in each die. This leaves a region referred to as a "mesa" projecting upwardly from the lower electrode surface and covering the remaining area of the die. The area of the die occupied by the lower electrode surface does not emit light. It is desirable to keep the horizontal extent of this inactive area as small as possible.

The top electrode typically is formed on the top surface of the stack, i.e., the top surface of the top semiconductor layer, and makes ohmic contact with this top layer. Typically, the layers in the stack above the junction are transparent, so that light emitted at the junction can pass out of the stack through the top surface. The top electrode is arranged so that it does not block all of the emitted light. For example, an opaque top electrode may cover only a small portion of the top surface of each die. However, the current passing from such an electrode will tend to flow downwardly through the stack so that the current passes predominantly through the area of the junction disposed beneath the electrode. This phenomenon, referred to as "current crowding," results in light emission concentrated in that area of the junction beneath the electrode, precisely where it will be most effectively blocked by the electrode. The amount of useful light reaching the outside of the die per unit of electrical current passing through the die, commonly stated as the external quantum efficiency of the die, is reduced by this phenomenon. Current crowding is a significant consideration with LEDs formed from materials having relatively high electrical resistivity, such as the gallium nitride-based materials.

To alleviate the current crowding problem, LEDs have been provided with transparent top electrodes, formed from thin layers of metals and metal compounds. A pad, which is typically opaque, occupies a small portion of the top surface. The transparent top electrode spreads the current in horizontal directions from the pad, so that current flow down through the stack is spread more evenly over the horizontal extent of the mesa. However, the top electrode normally must be quite thin in order to make it transparent and minimize the amount of light absorbed by the electrode. Therefore, the transparent electrode typically has significant resistance to current flow in the horizontal directions. There may still be significant current crowding in the area beneath the pad of the top electrode pad unit.

Other types of LED's use relatively thick semiconductor fusion and current diffusion layers above the junction. For example, AlInGaP type LEDs typically have a structure as shown in FIG. 1. LED 10 includes an n-type GaAs substrate 12. An n-type AlGaInP lower cladding layer 14, an AlGaInP active layer 16, a p-type AlGaInP upper cladding layer 18, and a thick p-type GaP layer 20. The GaP layer 20 serves as a current diffusion layer. A p-type electrode pad 22 is formed on the p-type GaP layer, and an n-type electrode 24 is formed on the lower face of n-type GaAs substrate 12. Due to the relatively thick GaP layer, a transparent top electrode is normally not required to allow the current to diffuse to the active layer 16. Nonetheless, the p-type electrode pad tends to block a significant part of the light emitted from the active layer. This results in reduced light extraction from AlInGaP LEDs. Despite the current spreading effect of the thick GaP layer, current crowding beneath the electrode pad is also a problem with AlGaInP LEDs. There is a need to alleviate the problems of current crowding and reduced light extraction beneath the electrode pad.

SUMMARY OF THE INVENTION

The present invention addresses these needs.

One aspect of the invention provides a light-emitting diode that includes a stacked structure. The stacked structure incorporates a first region of a first conductivity type, a second region of a second conductivity type and a light-emitting p-n junction between these regions. An upper portion of the first-type region defines a generally horizontal first contact surface.

The light emitting diode according to this aspect of the invention preferably includes a pair of electrodes for applying voltage to the diode. A first electrode preferably includes a first pad in contact with the first contact surface. According to this aspect of the invention, a reflector is disposed beneath the first pad, and the reflector includes walls that are oblique with respect to the first contact surface.

According to another aspect of the invention, the reflector is cone-shaped. In another aspect of the invention, the reflector is contained within the first region of the first conductivity type. In still another aspect of the invention, the reflector contains dielectric material.

DETAILED DESCRIPTION OF THE PREFERRED EMBODIMENTS

Figure 1:
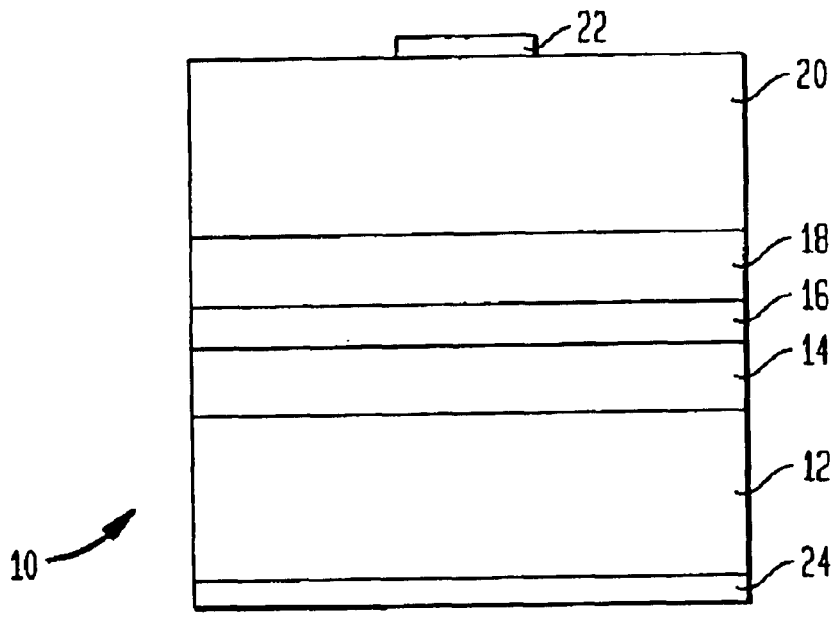
FIG. 1 is a front elevational view of a prior art LED.
Figure 2:
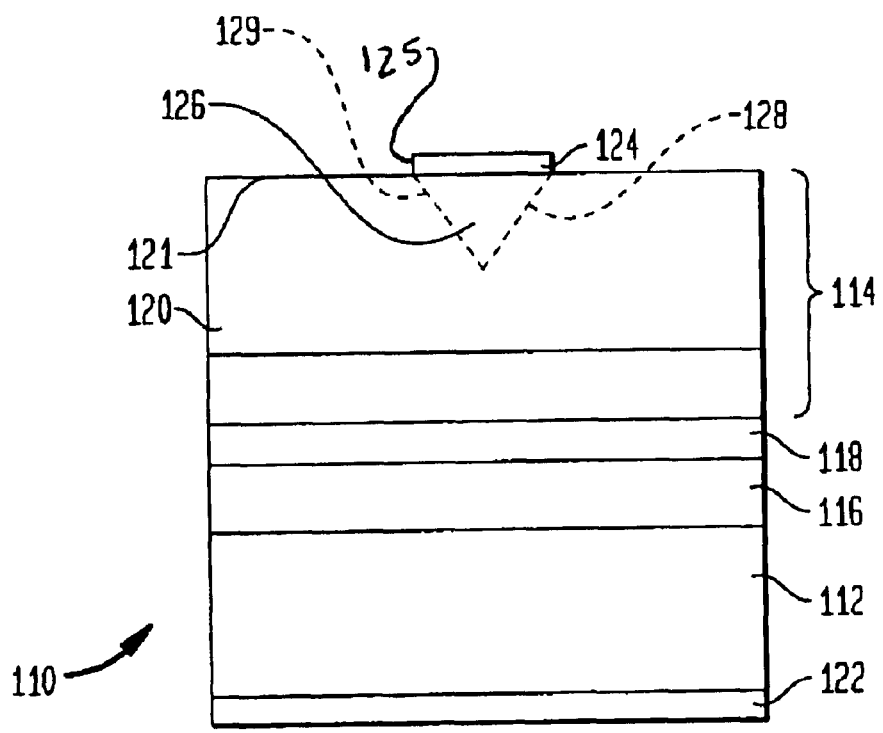
FIG. 2 is a front elevational view of an LED in accordance with one embodiment of the invention.

FIG. 2 shows an LED in accordance with one embodiment of the invention. The LED includes a stacked structure of semiconductor layers 110 on a substrate 112. In a preferred embodiment in which the LED is an AlInGaP LED, the substrate is a semiconductor material such as n-type GaAs. The stacked structure includes semiconductor material of a first conductivity type in a first or upper region 114 of the stack and material of a second, opposite conductivity type in a second or lower region 116 adjacent substrate 112. For example, the first or upper region 114 may be formed from a p-type semiconductor whereas the second or lower region 116 may be formed from an n-type semiconductor. The semiconductors may be III–V semiconductors, for example, AlInGaP materials. The term "gallium phosphide based semiconductor" as used herein refers to a phosphide based semiconductor including gallium. However, the present invention is not limited to a particular type of semiconductor. Other semiconductor materials, including other III–V materials such as, for example, GaN, are within the scope of this invention. The p-type and n-type conductivity may be imparted by conventional dopants and may also result from the inherent conductivity type of the particular semiconductor material.

The stacked structure 110 includes a junction 118 between the first and second regions. The junction is symbolized in FIG. 2 as a discrete layer interposed between regions 114 and 116. In practice, the first and second regions may abut one another so that they define the junction at their mutual border. Alternatively, the junction may include additional layer structures in the mutually adjacent portions of regions 114 and 116 or between these regions. For example, regions 114 and 116 may include clad layers adjacent junction 118. The clad layers typically have greater band gap than the material constituting the junction. Thus, the junction may be a simple homojunction; a single heterojunction, a double heterojunction, a multiple quantum well or any other type of junction structure.

Also, each of regions 114 and 116 can include any number of layers. Merely by way of example, the second or lower region may incorporate a "buffer layer" at the interface with substrate 112. In the embodiment shown in FIG. 2, a diffusion layer 120 is included in the first region 114 and is shown as a separate layer. The diffusion layer 120 may be formed from GaP or AlGaAs. The diffusion layer 120 allows current to diffuse into the LED structure. The diffusion layer 120 will be of the same conductivity type as the remainder of the first region 114. The diffusion layer 120 may incorporate a highly doped contact layer at the top of the stack to aid in establishing ohmic contact with a top electrode discussed below. The diffusion layer includes a first contact surface 121 for establishing contact with the contact pad described below. The fabrication processes used to form the stacked structure are well known. Most commonly, the various layers which form the stacked structure are deposited on the substrate in sequence by techniques such as metal organic chemical vapor deposition ("MOCVD") molecular beam epitaxy and the like.

A lower electrode 122 may be formed on the lower surface of substrate 112. It will be understood that this lower electrode arrangement may be used when the substrate is an n-type substrate, such as GaAs.

An upper electrode includes a first contact pad 124 in contact with contact surface 121. Preferably, the first contact pad 124 includes a metal that will form ohmic contact with contact surface 121. Examples of such metals include gold (Au) and nickel (Ni).

The first contact pad 124 preferably includes an uppermost layer of a conductive metal such as gold or aluminum. The exposed layer provides a suitable surface for wire bonding. Desirably, this pad is as small as possible consistent with the requirements of the bonding operation used to connect the pad to external circuitry.

A reflector 126 is disposed beneath the first contact pad 124, and the reflector preferably includes walls 128 and 129 that are oblique with respect to the first contact surface 121. For example, the reflector may be cone-shaped. Preferably, the reflector is contained within diffusion first region 114, and in the embodiment shown in FIG. 2, preferably the reflector is contained within diffusion layer 120. The reflector is formed by etching in the area beneath the location where the contact pad 124 will be placed. Suitable etching methods include wet chemical etching or reactive ion etching techniques. In one embodiment, the reflector contains dielectric material. Examples of suitable dielectric materials include $SiO_2$, SiNx, $Al_2O_3$, $TiO_2$, and combinations deposited in thin film layers to maximize reflectivity (such as in distributed Bragg reflector structures) and may be deposited by plasma enhanced chemical vapor deposition (PECVD), electron beam (e-beam) or spattering. The dielectric material does not extend to the edges of pad 124. Thus, edge regions 125 of the pad remain in contact with the semiconductor material of the diffusion layer.

In use, the first contact pad 124 and electrode 122 are connected by wire bonds to an external electrical power source not shown. Current flows between pad 124 and electrode 122 through the stacked structure, so that light is emitted at junction 118. The dielectric in reflector 126 beneath the pad 124 restricts current flow into the diffusion layer to the edges of the pad end thus tends to limit current flow to the edges of the diffusion layer 120 and junction 118 underlying the pad. The dielectric thus promotes current spreading through the horizontal extent of the diffusion layer 120 and uniform distribution of the current through the horizontal extent of junction 118. Moreover, that portion of the light generated at junction 118 that is directed toward pad 124 will be reflected by the surface of reflector 126. Thus, this portion of the light will be directed out from under the pad 124 and towards the side of the LED chip, improving the extraction efficiency of the LED chip.

It will be understood that the invention is not limited to any particular arrangement of electrodes. For example, if an electrically insulating substrate is used for growth of the semiconductor under layers and is left in place, an electrode cannot be provided on the bottom surface of the bottom layer. As one example, gallium nitride-based materials such as GaN, AlGaN, InGaN and AlInGaN are used to form LEDs emitting light in various wavelength ranges including blue and ultraviolet. These materials typically are grown on insulating substrates such as sapphire or alumina.

Therefore, for LEDs incorporating an insulating substrate, the upper layer or layers of the stack are typically removed after formation of the stack in a region covering part of the area of each die, so as to provide an upwardly-facing lower contact surface on a layer at or near the bottom of the stack in each die. This leaves a region referred to as a "mesa" projecting upwardly from the lower electrode surface and covering the remaining area of the die. In this arrangement, the mesa defines the top or first contact surface.

Figure 3:
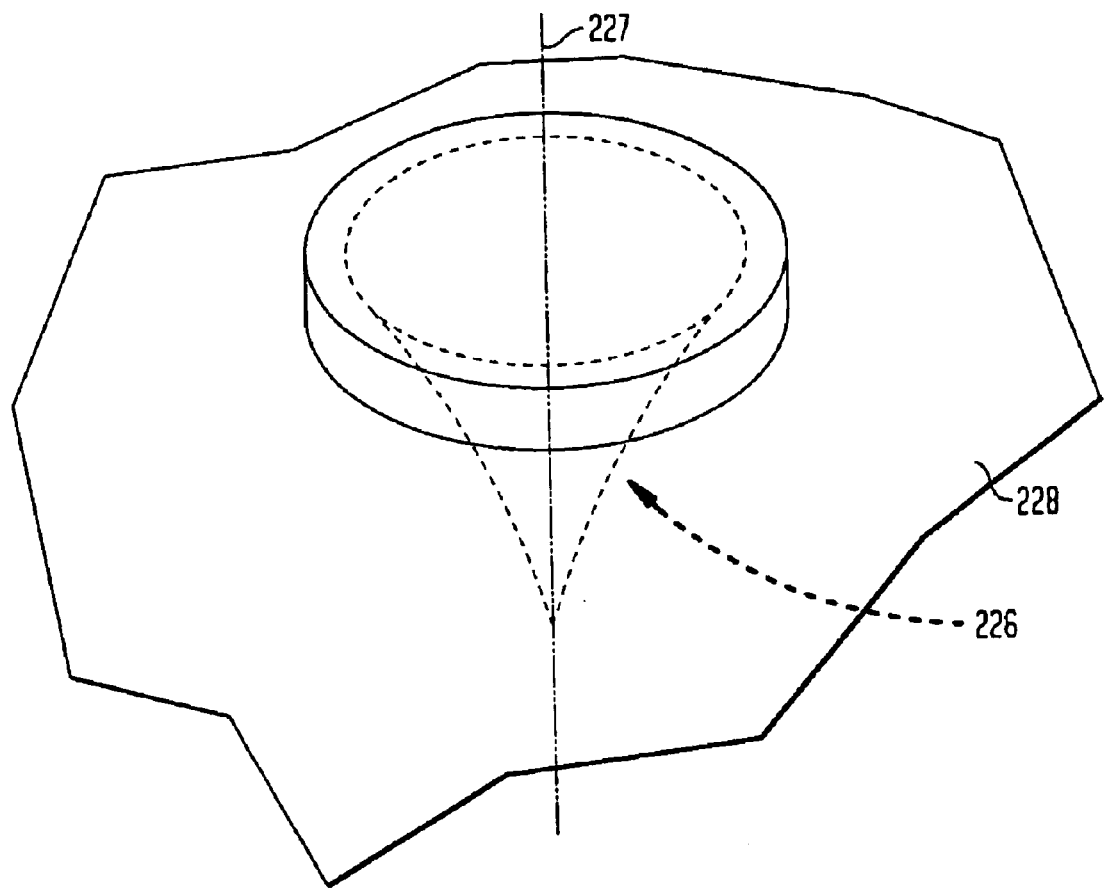
FIG. 3 is a fragmentary, perspective elevational view of a reflector in accordance with another embodiment of the invention.
Figure 4:
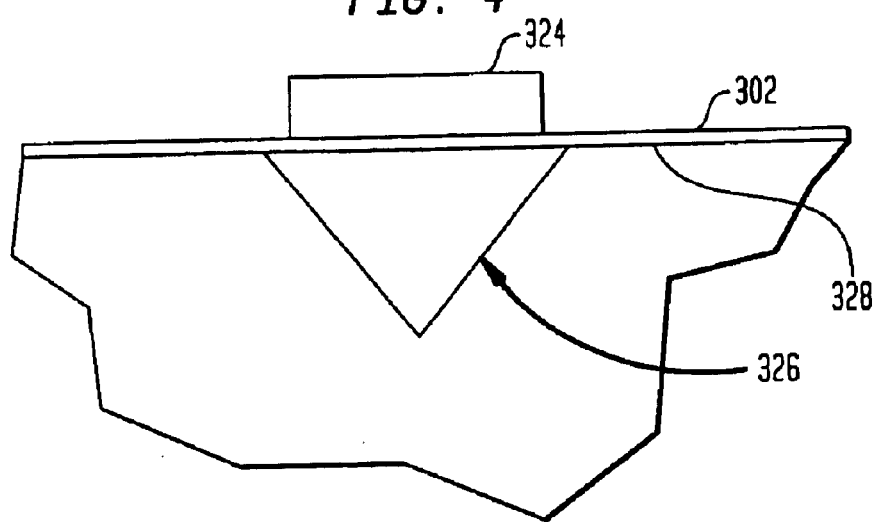
FIG. 4 is a fragmentary cross-sectional view of a reflector in accordance with another embodiment of the invention.

It should be appreciated that the figures are not drawn to scale. In particular, the thicknesses of the various layers have been greatly exaggerated for clarity of illustration. Typically, the entire stack is on the order of a few microns thick as, for example, five microns thick. The horizontal dimensions of the die, such as the overall die width W and die length L are on the order of a few hundred microns as, for example, about 200–700 microns. The die is typically rectangular or, most preferably, square with equal width and length. The height or vertical extent of the reflector typically is about 1 to about 5 microns. However, this is not limiting; the reflector can extend downwardly to the junction. In a less preferred embodiment, it may even extend below the junction to the bottom of the device. The reflector need not be conical. For example, it may be prismatic or pyramidal, with some or all of its wells oblique to the contact surface. Alternatively, as shown in FIG. 3, the reflector may be in the form of a surface of revolution about an axis transverse to the first contact surface as, for example, surface 226 shaped like the bell of a horn having an axis 227 and having its large end facing upwardly of the first contact surface 228. Also, the reflector may extend outwardly to or beyond the periphery of the pad. For example, the reflector may include conductive material so that the reflector forms a downward continuation of the pad. The reflector itself may or may not make ohmic contact with the material of the first region. Most preferably, the reflector does not make ohmic contact with the first region; i.e., the reflector is either dielectric or, if conductive, forms a current-blocking junction with the material of the first region. In this case, the reflector substantially reduces current flow in the region of the stacked structure below the first pad. This helps to concentrate current in the region of the structure outside of the area covered by the pad. This further enhances the light extraction efficiency of the structure. Alternatively, as shown in FIG. 4, where a transparent electrode 302 extends beyond the pad 324, a dielectric reflector 326 may extend beyond the pad. The electrode 302 provides a conductive path from pad 324 to surface 328 around the periphery of the electrode.

Although the preferred embodiments have been described above with reference to particular semiconductor materials, it will be appreciated that the invention can be applied with dies formed from other semiconductor materials as well. Also, the conductivity types can be reversed, so that in some cases the first or upper region can be formed from n-type semiconductor material whereas the second or lower region may be formed from p-type semiconductor materials.

As these and other variations and combinations of the features discussed above can be utilized without departing from the present invention, the foregoing description of the preferred embodiments should be taken by way of illustration rather than by way of limitation of the invention as defined by the claims.

What is claimed is:

1. A light-emitting diode comprising:

(a) a stacked structure including a first region of a first conductivity type, a second region of a second conductivity type and a light-emitting p-n junction between said regions, said first-type region defining a first contact surface, said second-type region defining a second contact surface;

(b) a first pad electrically connected to said first region, the first pad overlying said first contact surface; and (c) a reflector disposed beneath said first pad, the reflector including reflective walls that are oblique with respect to the first contact surface.

2. A light-emitting diode as claimed in claim 1, wherein said reflector is cone-shaped.

3. A light emitting diode as claimed in claim 2, wherein the reflector is contained within the first region of the first conductivity type.

4. A light-emitting diode as claimed in claim 2, wherein said reflector contains dielectric material.

5. A light-emitting diode as claimed in claim 4, wherein said first conductivity type is p-type and said second conductivity type is n-type.

6. A light-emitting diode comprising:

(a) a stacked structure including a first region of a first conductivity type overlying a second region of a second conductivity type and a light-emitting p-n junction between said regions, said first-type region defining a first contact surface, said second-type region defining a second contact surface, said structure having a side;

(b) a first pad electrically connected to said first region, the first pad overlying said first contact surface; and (c) a reflector disposed beneath said first pad, the reflector having walls for reflecting light away from said first pad and toward the side of the structure.

7. A light-emitting diode as claimed in claim 6, wherein said walls of said reflector define a cone-shaped reflector.

8. A light emitting diode as claimed in claim 6, wherein the reflector is contained within the first region of the first conductivity type.

9. A light-emitting diode as claimed in claim 6, wherein said reflector comprises dielectric material located adjacent said first pad and directing current from said first pad toward portions of said junction adjacent said sides.

10. A light-emitting diode as claimed in claim 9, wherein said first pad has edge regions in contact with said first contact surface.

11. A light-emitting diode as claimed in claim 10, wherein said dielectric material does not extend to said edge regions and said edge regions are in contact with said first contact surface.

12. A light-emitting diode as claimed in claim 6, wherein said first conductivity type is p-type and said secondary conductivity type is n-type.

13. A light-emitting diode as claimed in claim 6, wherein said reflector comprises dielectric material deposited in an etched location of said first region.

\* \* \* \* \*